United States Patent [19]

Wakita et al.

[11] Patent Number: 4,978,881
[45] Date of Patent: Dec. 18, 1990

[54] PIEZOELECTRIC ACTUATOR OF LAMINATION TYPE

[75] Inventors: Naomasa Wakita, Nagoya; Hideharu Aoki, Ichinomiya; Makoto Okuda, Nagoya, all of Japan

[73] Assignee: NGK Spark Plug Co., Ltd., Nagoya, Japan

[21] Appl. No.: 381,285

[22] Filed: Jul. 18, 1989

[30] Foreign Application Priority Data

Aug. 20, 1988 [JP] Japan ................. 63-95959

[51] Int. Cl.⁵ .............................. H01L 41/08
[52] U.S. Cl. ....................... 310/328; 310/364; 310/366
[58] Field of Search ............... 310/328, 325, 363-366

[56] References Cited

FOREIGN PATENT DOCUMENTS

| 0140173 | 8/1983 | Japan | 310/366 |
| 59-0204288 | 11/1984 | Japan | 310/328 |
| 0231884 | 12/1984 | Japan | 310/328 |
| 0176282 | 9/1985 | Japan | 310/366 |

OTHER PUBLICATIONS

A Piezoceramic fine-movement control by Mills et al., Institute of Physics, J. Phys. E. Sci Instrum. vol. 14, 1981, pp. 295, 296.

*Primary Examiner*—Mark O. Budd
*Attorney, Agent, or Firm*—Brady, O'Boyle & Gates

[57] ABSTRACT

A piezoelectric actuator of a lamination or stack type has a plurality of sheet-like electrostrictive elements and oppositely poled electrode layers provided on the major surfaces of the each element, respectively, each electrode layer being arranged so as to define an insulating zone on the one end portion of the associated major surface. An insulating gap is formed between the adjacent elements by the insulating zone(s) and is filled with an elastic material.

6 Claims, 1 Drawing Sheet

PIEZOELECTRIC ACTUATOR OF LAMINATION TYPE

BACKGROUND OF THE INVENTION

The present invention relates to a piezoelectric actuator which is utilized to precisely move tools for a precision machine tool, pistons for a hydraulically controlled apparatus, samples in an electron microscope, or the like in the order of microns.

A conventional actuator having an electrostrictive element assembly is shown in FIG. 1 of the accompanying drawing. It comprises a laminated body of a plurality of sheet-like electrostrictive elements 1 which are connected to each other mechanically in series and electrically in parallel, and are axially displaced when a voltage is applied thereto.

Each of the electrostrictive elements 1 is provided with electrode layers 1a and 1b on the major surfaces which are connected every other. It is arranged so that the electrode layer 1a on one major surface of each electrostrictive element 1 has one polarity and the electrode layer 1b on the other major surface of each electrostrictive element 1 another polarity. The electrostrictive elements 1 are laminated in such a manner that the electrode layers 1a and 1a, or 1b and 1b having the same polarity of the adjacent electrostrictive elements are abutted or connected to each other. The exposed end portions of the abutted electrode layers 1a and 1a or 1b and 1b between the adjacent electrostrictive elements 1 are alternately coated with insulating material 2 so that the electrode layers 1a having one polarity are electrically separated from those layers 1b having the other polarity. The electrode layers 1a having one polarity are connected to one electrode terminal 3a of a pair of electrode terminals 3a and 3b which are provided on the side edge portions of the laminated body and the electrode layers 1b having the other porality are connected to the other electrode terminal 3b.

Such actuators are also disclosed in U.S. Pat. Nos. 4,523,121 and 4,011,474.

Furthermore, in U.S. Pat. No. 4,523,121 there is disclosed another arrangement which comprises a plurality of electrostrictive elements defined by a plurality of internal electrodes, each internal electrode has one end terminated on a lateral edge portion of the associated element and the other end of each internal electrode is terminated adjacent to the opposite lateral edge portion of the element to prevent the other end from making contact with a pair of external electrodes which are provided along the lateral edges of the electrostrictive elements.

A similar arrangement is also disclosed in U.S. Pat. No. 4,087,716, in which a plurality of laminations of piezoelectric ceramic material is provided, on the upper size of each layer and underneath each layer are provided metal layers which are alternately connected to external connection contacts provided along the lateral edges of the laminations, and the metal layers overlapped between the adjacent ceramic layers are intended not to occupy the entire area of the ceramic layers in order to provide sufficient mutual electrical insulation of the oppositely poled metal layers at the edges of the ceramic layers.

With such a conventional laminated type piezoelectric actuator as illustrated in FIG. 1, when an insulating paint casting is used to cover the exposed end portions of the electrode layers between the adjacent electrostrictive elements, it is difficult to form the actuator with a certain precision in dimensions because some protrusion in the direction of the lamination may unavoidably be formed by the insulator coating. Such protrusion of the insulator coatings may be rubbed and exfoliated upon assembling of the actuator into a desired apparatus and therefore the outer edge of the electrode layers may be exposed causing a deterioration of the insulating property.

Further, in the conventional arrangement as disclosed in U.S. Pat. No. 4,523,121 or 4,087,716, the above mentioned disadvantages do not occur, but there may be produced a distortion at the abutted or superimposed portions having the same polarity between the adjacent electrostrictive elements While there may be produced no distortion at the portions, insulating gaps, not superimposed between the adjacent electrostrictive elements when the voltage is applied. Therefore, a crack may be produced in the insulating gaps by means of an internal stress when the electric field is increased beyond a certain level.

SUMMARY OF THE INVENTION

It is therefore an object of the present invention to provide a piezoelectric actuator having laminated electrostrictive elements, which is capable of overcoming the problems or disadvantages of the conventional actuators.

Another object of the present invention is to provide a piezoelectric actuator of the above-mentioned type which can stably be operated over a long period of time.

According to the present invention, there is provided a piezoelectric actuator of a lamination type comprising a sintered lamination body of a plurality of sheet-like electrostrictive elements, electrode layers each provided on at least one of the major surfaces of said each electrostrictive element, each electrode layer having one end extended to one lateral edge of said respective electrostrictive elements and the other end terminated spaced from the other lateral edge of said respective electrostrictive elements to define an insulating zone, insulating gaps each provided between said adjacent electrostrictive elements by said respective insulating zones and disposed alternately, each of said insulating gaps being filled with elastic material for absorbing or reducing any internal stress produced in said respective insulating zone, and a pair of external negative and positive electrodes being respectively and commonly connected to the one ends of said electrode layers exposed on the lateral edges of said electrostrictive elements.

According to a preferred embodiment, each electrostrictive element may be provided with oppositely poled electrode layers on its upper and lower surfaces. The electrode layers having the same polarity of the adjacent electrostrictive elements may be bonded together by using epoxy resin or the like.

Each insulating gap is filled with elastic material having a relatively low Young's modulus of elasticity such as resin or rubber material by means of dipping with a vacuum deaerator.

The present invention will now be described by way of example with reference to the accompanying drawing:

DETAILED DESCRIPTION

Figure 1:
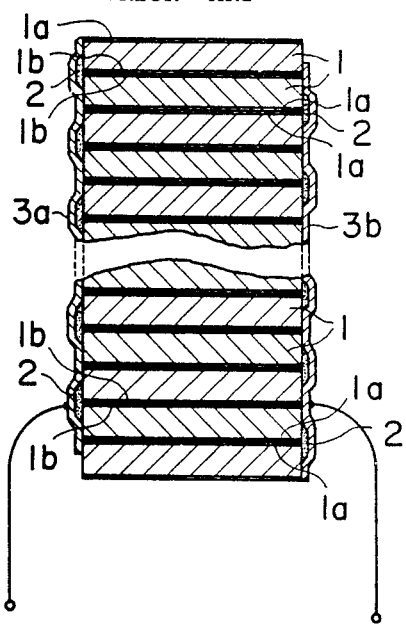
FIG. 1 is a sectional view schematically showing a conventional piezoelectric actuator of a laminated multilayer type.
Figure 2:
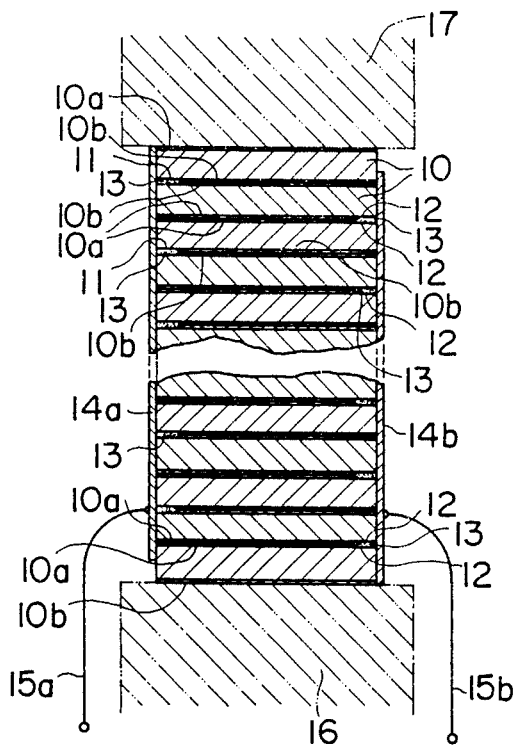
FIG. 2 is a sectional view schematically showing an actuator according to the present invention.
Figure 3:
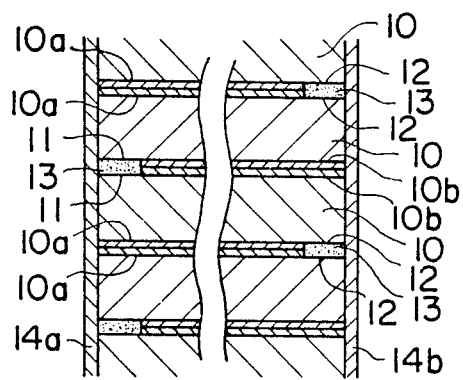
FIG. 3 is an enlarged schematic sectional view partially showing the actuator of FIG. 2.

Referring now to FIGS. 2 and 3, there is shown an essential construction of an actuator according to one embodiment of the present invention.

The reference numeral 10 represents a plurality of electrostrictive elements made of piezoelectric material such as lead titanate-zirconate. Each electrostrictive element 10 has major surfaces provided with electrode layers 10a and 10b which may be formed by a silver baking, and is properly polarized in the thickness thereof. One of the electrode layers 10a and 10b on each electrostrictive element 10 has a positive polarity and the other electrode layer a negative polarity. The electrostrictive elements 10 are connected mechanically in series and electrically in parallel to each other to form a lamination in such a manner that the electrode layers 10a and 10a or 10b and 10b of the same polarity on the adjacent elements 10 are abutted and bonded to each other. The bonding between the electrode layers 10a and 10a or 10b and 10b of the same polarity on the adjacent elements 10 may be made by using epoxy resin or the like. The electrode layers 10a and 10b on the respective elements 10 have dimensions to define insulating zones 11 or 12 between the one end portions of the adjacent electrostrictive elements 10 when they are laminated, which zones are formed by the mating electrode layers 10a and 10b terminating inwardly from or space inwardly from the adjacent ends of the adjacent elements 10. That is, it is arranged that the insulating zones 11 and 12 form insulating gaps between the one end portions of the adjacent electrostrictive elements 10, respectively and the insulating zones or insulating gaps are positioned alternatively adjacent opposite end portions of the elements 10. The thus formed insulating gaps are filled with elastic material 13 having a relatively low Young's modulus of elasticity such as resin or rubber material which may be inserted thereinto for example by dipping with a vacuum deaerator. The end portions of the electrode layers opposite to the insulating gaps extend to and are exposed on the opposite lateral edges of the elements 10. The exposed end portions of the electrode layers 10a of one porality is commonly connected to one external electrode 14a of a pair of external electrodes, and the exposed end portions of the electrode layers 10b is commonly connected to the other external electrode 14b of the pair of external electrodes. The external electrodes 14a and 14b are connected to a suitable power source, not shown, via lead conductors 15a and 15b, respectively. The laminated assembly of the electrostrictive elements 10 is mounted between a base member 16 and a member 17 to be driven.

In the illustrated embodiment, the lead conductors 15a and 15b may be connected to the base member 16 and the member 17.

Further, the polarization of the electrostrictive elements may be performed at the same time after the laminating of the electrostrictive elements. In that case the electrode layer may be provided only on one of the major surfaces, the upper or lower surface of the each electrostrictive element.

One example of the illustrated device will now be described.

There were prepared fifty electrostrictive elements each of which was made of lead titanate-zirconate and was cut into an 8 mm × 8 mm piece having a thickness of 0.2 mm. On the upper and lower surfaces of each element electrode layers were provided by silver baking excepting in the insulating zones of 0.5 mm width on the one end portion of the upper surface and the opposite end portion of the lower surface, respectively. Following this, the electrostrictive elements were laminated by adhering them one to another with epoxy resin and then were polarized by means of a conventional method. Then, epoxy resin was introduced into the respective insulating gaps defined by the insulating zones on the facing surfaces between the adjacent elements by using a vacuum deaerator.

The actuator obtained in this manner was operated for 1500 hours with a voltage of 200 V DC and 100 Hz and as a result did not exhibit any fault such as a crack.

As mentioned hereinbefore, according to the actuator of the present invention, the internal stress produced in each insulating space defined on the main surfaces of the each element can be absorbed or reduced by the inserted elastic member, and therefore the actuator can be stably operated over a long period without producing of any crack.

It is to be understood that the above-mentioned embodiments are only illustrative of the application of the principles of the present invention. Numerous modifications and alterations may be made by those skilled in the art without departing from the spirit and scope of the invention, and the appended claims are intended to cover such modifications and alterations.

What is claimed is:

1. A piezoelectric actuator of a lamination type comprising a sintered lamination body of a plurality of sheet-like electrostrictive elements having opposite lateral edges, electrode layers each provided on at least one of the major surfaces of said each electrostrictive element, each electrode layer having one end extended to one lateral edge of said respective electrostrictive elements and the other end thereof terminated inwardly from the opposite lateral edge of said respective electrostrictive elements to define an insulating zone, insulating gaps each provided between said adjacent electrostrictive elements by said respective insulating zones and disposed alternately adjacent opposite lateral edges of said plurality of electrostrictive elements, each of said insulating gaps being filled with elastic material for absorbing and reducing any internal stress produced in said respective insulating zone, and a pair of external negative and positive electrodes positioned respectively on said opposite lateral edges, and being respectively and commonly connected to the said one ends of said electrode layers exposed on the respective lateral edges of alternate said electrostrictive elements.

2. A piezoelectric actuator of a lamination type according to claim 1, wherein said electrostrictive elements are connected mechanically in series and electrically in parallel to each other to form said lamination body, and said electrode layers of the same polarity on the adjacent elements are abutted and bonded to each other.

3. A piezoelectric actuator of a lamination type according to claim 1, wherein said each electrode layer is provided on the major surface of said respective electrostrictive element by silver baking.

4. A piezoelectric actuator of a lamination type according to claim 1, wherein said each electrostrictive element is provided with oppositely poled electrode layers on its upper and lower surfaces, and said electrode layers having the same polarity of adjacent electrostrictive elements being bonded together by epoxy resin or the like.

5. A piezoelectric actuator of a lamination type according to claim 1, Wherein said elastic material filled into said each insulating gap comprises material having a relatively low Young's modulus of elasticity such as resin or rubber material.

6. A piezoelectric actuator of a lamination type according to claim 1, wherein said elastic material is filled into said each insulating gap by means of dipping with a vacuum deaerator.

* * * * *